(12) United States Patent
Goetz et al.

(10) Patent No.: US 6,300,161 B1
(45) Date of Patent: Oct. 9, 2001

(54) MODULE AND METHOD FOR INTERCONNECTING INTEGRATED CIRCUITS THAT FACILITATES HIGH SPEED SIGNAL PROPAGATION WITH REDUCED NOISE

(75) Inventors: Martin P. Goetz, Discovery Bay; John Zasio, Sunnyvale, both of CA (US)

(73) Assignee: Alpine Microsystems, Inc., Campbell, CA (US)

( * ) Notice: Subject to any disclaimer, the term of this patent is extended or adjusted under 35 U.S.C. 154(b) by 0 days.

(21) Appl. No.: 09/504,061

(22) Filed: Feb. 15, 2000

(51) Int. Cl.[7] .............................. H01L 21/44; H01L 29/00
(52) U.S. Cl. ..................... 438/106; 438/108; 438/110; 438/459; 438/464; 257/528; 257/532; 257/684; 257/700
(58) Field of Search ..................................... 438/106, 108, 438/110, 455, 459, 464; 257/531, 536, 528, 532, 684, 700; 361/766, 765, 782, 761, 764, 772, 777

(56) References Cited

U.S. PATENT DOCUMENTS

| | | | |
|---|---|---|---|
| 5,134,539 | * 7/1992 | Tuckerman et al. | 257/532 |
| 5,135,889 | 8/1992 | Allen | 437/195 |
| 5,583,739 | 12/1996 | Vu et al. | 361/313 |
| 5,633,785 | * 5/1997 | Parker et al. | 257/528 |
| 5,729,047 | 3/1998 | Ma | 257/664 |
| 5,872,697 | 2/1999 | Christensen et al. | 361/313 |
| 5,874,770 | 2/1999 | Saia et al. | 257/536 |
| 5,973,910 | 10/1999 | Gardner | 361/313 |
| 6,075,711 | * 6/2000 | Brown et al. | 257/684 |

FOREIGN PATENT DOCUMENTS

WO 98/18303  4/1998 (WO).

OTHER PUBLICATIONS

"Processors Put Pressure on Packages, A Review of the Packages Housing Modern PC Processors", Dennis Herrell; Microprocessor Report; Dec. 27, 1999; pp. 12–15.

* cited by examiner

Primary Examiner—Matthew Smith
Assistant Examiner—Igwe U. Anya
(74) Attorney, Agent, or Firm—Kenneth C. Brooks

(57) ABSTRACT

A module and method for interconnecting integrated circuits. The module includes an insulative body that features conductive traces having differing resistivities associated therewith. To that end, the insulative body has, disposed therein, a conductive bond pad and a plurality of spaced apart conductive traces, one of which is in electrical communication with the bond pad, with each of the plurality of conductive traces are formed from a material having a resistivity associated therewith. The resistivity of the material from which one of the plurality of conductive traces is formed being greater than the resistivity of the material from which the remaining conductive traces are formed and defines a decoupling capacitor therebetween.

15 Claims, 7 Drawing Sheets

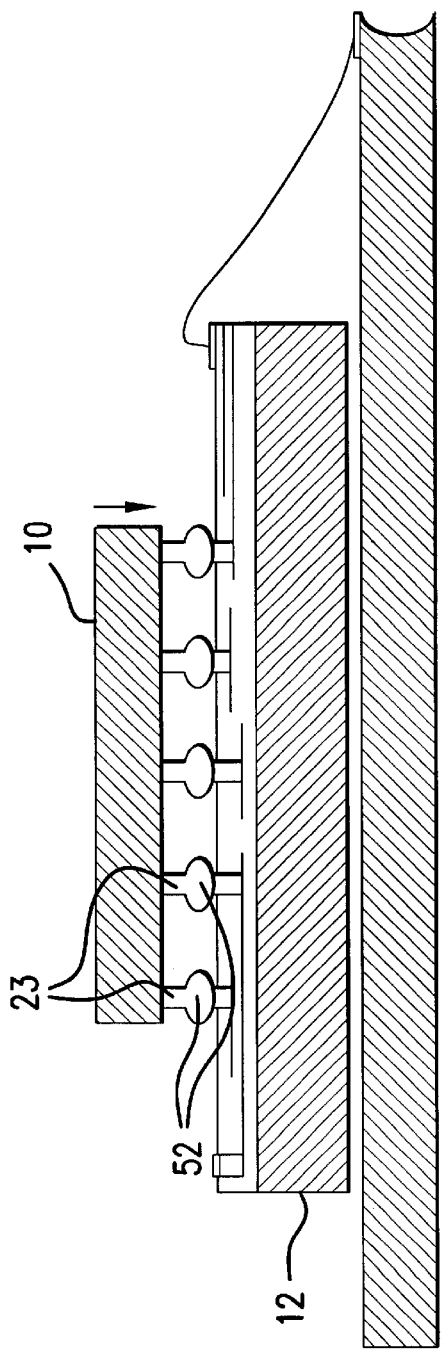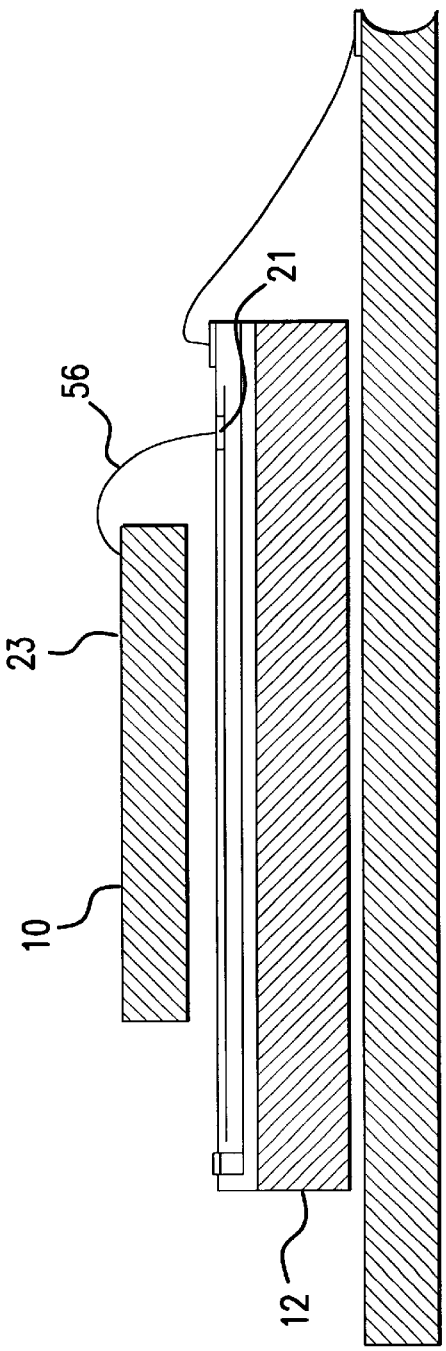

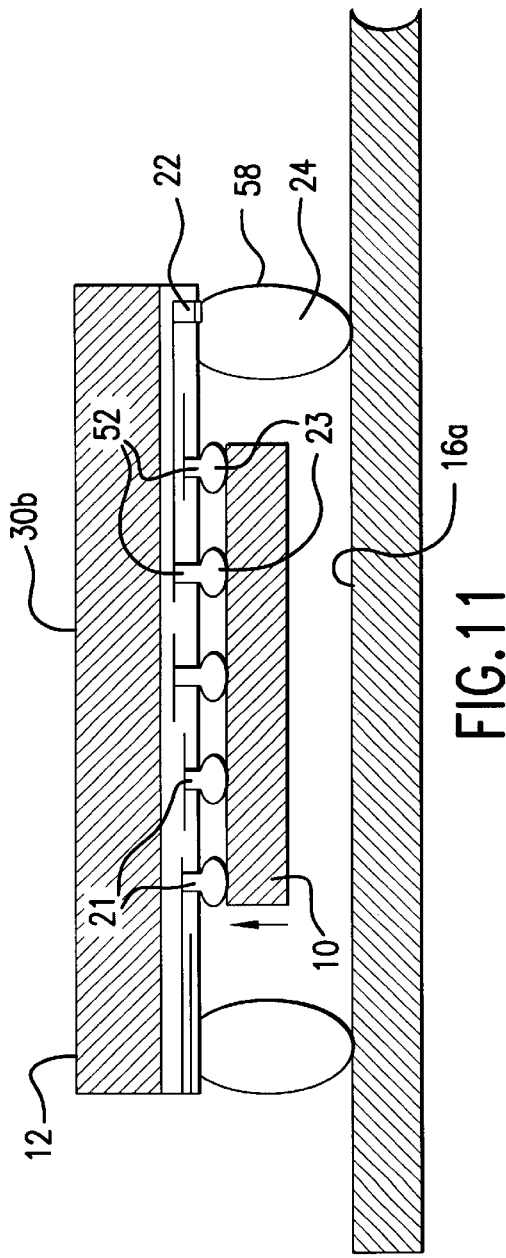
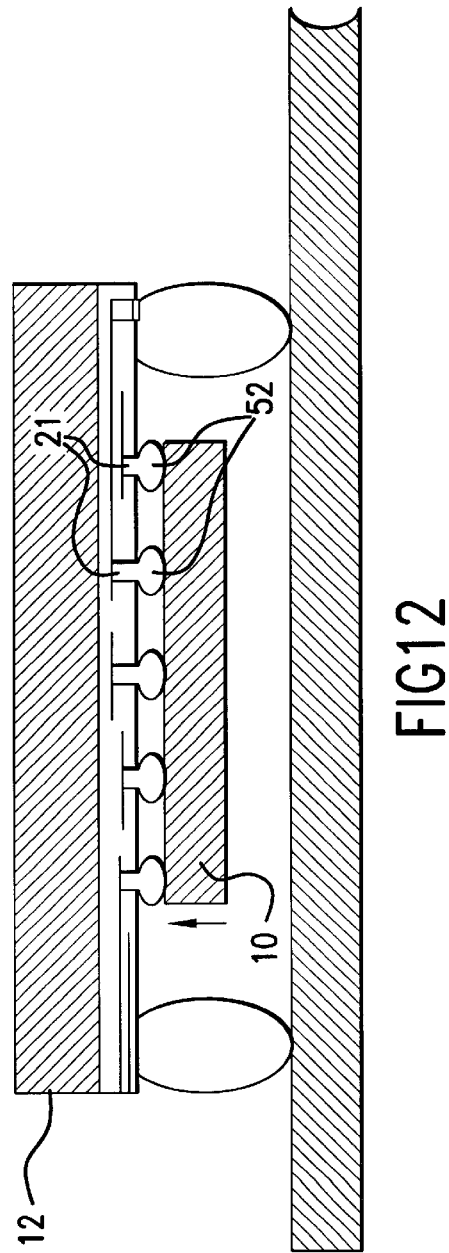

MODULE AND METHOD FOR INTERCONNECTING INTEGRATED CIRCUITS THAT FACILITATES HIGH SPEED SIGNAL PROPAGATION WITH REDUCED NOISE

FIELD OF THE INVENTION

The present invention relates to the packaging of semiconductor devices, and more particularly to module and method for interconnecting integrated circuits (ICs) on a semiconductor substrate.

BACKGROUND OF THE INVENTION

As the operational frequency and integration increases, the overall performance of electronic systems becomes increasingly sensitive to the capacitive, inductive and resistive characteristics of the ICs associated therewith, as well as the structures employed to interconnect the ICs. The aforementioned characteristics result in unwanted currents propagating along either a DC power trace or a signal trace that degrade the operation of the ICs. For example, during operation, the amount of current demand of an IC, such as a processor, can vary rapidly between milliamps to tens of amps. This may produce voltage spike in the power plane through which current is supplied to the IC. The magnitude of spikes are proportional to the frequency of operation of the IC. This produces a voltage drop across the inductance associated with the power planes in direct proportion to the rate of change of current. The voltage drop may substantially reduce the operational frequency of the IC. Prior art techniques to solve this problem include use of off-chip de-coupling capacitors distributed throughout the power plane on the printed circuit board to which the integrated circuit is mounted. However, the frequency of operation of the off-chip de-coupling capacitors were limited.

U.S. Pat. No. 5,973,910 to Gardner discloses a de-coupling capacitor that attempts to overcome the problems associated with off-chip de-coupling capacitors. Specifically, Gardner discloses reducing noise associated with current propagating along a DC power line embedded in an IC by connecting a de-coupling capacitor as close to a load as possible. To that end, Gardner discloses a de-coupling capacitor incorporated into an integrated circuit. The capacitor is disposed over a first region of a substrate comprising electronic circuitry, and not over a second region of the substrate. The capacitor comprises a lower and an upper conductive layer separated by an interposing insulative layer. An additional insulative layer is disposed beneath the lower conductive layer while another insulative layer is disposed above the upper conductive layer.

U.S. Pat. No. 5,872,697 to Christensen et al. discloses an integrated circuit having a de-coupling capacitor integrally formed therewith. The capacitor includes a dielectric film disposed over a final metal layer of the integrated circuit. A conductive film is disposed over the dielectric layer to provide capacitance in the dielectric layer. In this manner, the performance of the integrated circuit is described as being enhanced. Specifically, the performance is enhanced by facilitating higher switching speeds due to the faster response of the capacitor to power supply bounce resulting from large currents produced by the high speed switching. A drawback with the prior art techniques for reducing surge currents is that they typically require greatly increasing the area required to manufacture an integrated circuit due to the formation of the de-coupling capacitor or necessitate a limit in the operational frequency of the integrated circuit.

What is needed, therefore, is a technique for reducing surge currents without increasing the area required to form the integrated circuit or reducing the operational frequency of the same.

SUMMARY OF THE INVENTION

A module to interconnect ICs includes an insulative body that features a de-coupling capacitor defined by a dielectric layer disposed between conductive traces having differing resistivities. Typically, the de-coupling capacitor provides a capacitance per unit area in the range of 50 $nF/cm^2$ to 250 $nF/cm^2$. With this structure, the de-coupling capacitor provides a much lower impedance over a wider range of frequencies, and at higher frequencies, than previously attainable. In this manner, the surge currents associated with the inductance in the power planes is reduced.

The insulative body has, disposed therein, a conductive bond pad and a plurality of spaced apart conductive traces, one of which is in electrical communication with the bond pad. Each of the plurality of conductive traces is formed from a material having a resistivity associated therewith. The resistivity of the material from which one of the plurality of conductive traces is formed, defining a first conductive trace is greater than the resistivity of the material from which the remaining conductive traces are formed. In another embodiment, one of the remaining conductive traces is disposed adjacent to, but spaced-apart from, the first conductive trace, defining the de-coupling capacitor therebetween.

The method according to the present invention includes providing an insulative substrate and forming a conductive first layer on the substrate having a resistivity associated therewith. Adjacent to the conductive first layer, a first insulative layer is formed, followed by formation of a second conductive layer adjacent to the first insulative layer. The second conductive layer has a resistivity associated therewith that is less than the resistivity associated with the first conductive layer. Formed adjacent to the second conductive layer is a second insulative layer, with a third conductive layer being formed adjacent to the second conductive layer. A fourth conductive layer is formed adjacent to the third insulative layer. A contact point, in electrical communication with the third conductive layer, is formed adjacent to the fourth conductive layer.

These and other embodiments of the present invention, along with many of its advantages and features, are described in more detail in the text below and the attached figures.

BRIEF DESCRIPTION OF THE DRAWINGS

FIG. 9 shows interconnections of the components, shown above in FIG. 8, in accordance with an alternate embodiment of the present invention;

FIG. 10 shows interconnections of the components, shown above in FIG. 8, in accordance with a second alternate embodiment of the present invention;

FIG. 11 shows interconnections of the components, shown above in FIG. 8, in accordance with a third alternate embodiment of the present invention;

FIG. 12 shows interconnections of the components, shown above in FIG. 8, in accordance with a fourth alternate embodiment of the present invention.

DETAILED DESCRIPTION

Figure 1:
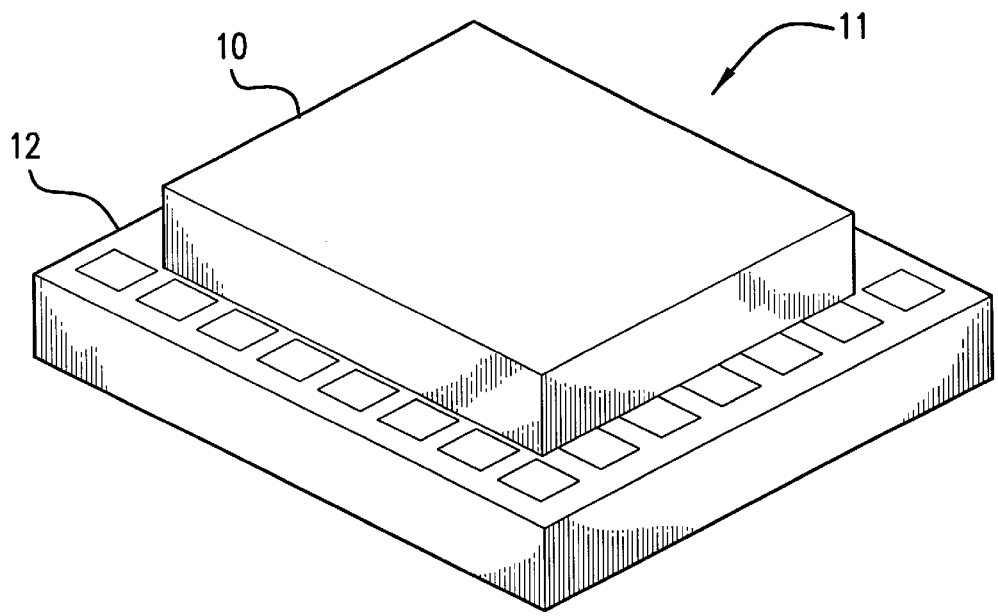
FIG. 1 is a perspective view of a subassembly including an integrated circuit attached to a module in accordance with the present invention.

FIG. 1 shows a single IC 10 attached to a module 12, defining a subassembly 11. The module 12 typically includes a plurality of conductive regions that may be less than, equal to, or greater than the density of the conductive areas on the IC 10, shown more clearly in FIG. 2. To that end, the module 12 has conductive regions 22 along its peripherals and conductive regions 21 around its central portion. For simplicity, a relatively small number of conductive regions 21 and 22 are shown.

Figure 2:
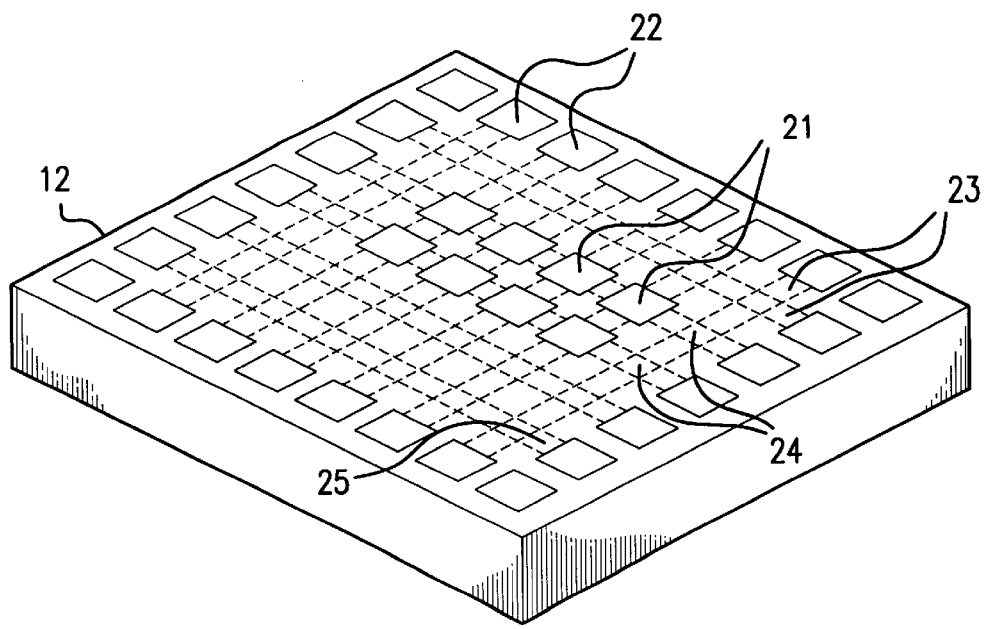
FIG. 2 is a perspective view of a module, shown above in FIG. 1, in accordance with the present invention.

Referring to both FIGS. 1 and 2, conductive regions 21 place IC 10 in electrical communication with the module 12. Conductive regions 22 facilitate electrical communication between the module 12 and an interconnect substrate (not shown), discussed more fully below. Conductive regions 21 may be routed to conductive regions 22 using embedded conductive traces 23 that interconnect at conductive vias 24. The conductive vias 24 extend between insulative layers that separate the conductive traces 23. As a result, the conductive traces 23 and conductive vias 24 allow signals to be communicated between the IC 10 and one or more of the conductive regions 22. Also included in the module 12 may be one or more pass-throughs 25, the location and arrangement of which are typically independent of the IC routing. The pass-throughs 25 facilitate communication between signals from a neighboring IC (not shown) to other neighboring ICs (not shown). In this manner, the pass-throughs 25 are typically electrically insulated from all of the conductive regions 21 and 22 associated with the same module 12 in which the pass-throughs 25 are embedded.

The layout of conductive regions 21 and 22 on the module 12 are arranged dependent upon the IC 10 that will be attached thereto. Flexibility in arranging the conductive regions 21 and 22 is achieved by fabricating the module 12 using semiconductor photolithography techniques. Specifically, conductive regions 21 are arranged to match the conductive areas (not shown) of the IC 10. This increases the choice of attachment techniques that may be employed to attach the IC 10 to the module 12, discussed more fully below.

Figure 3:
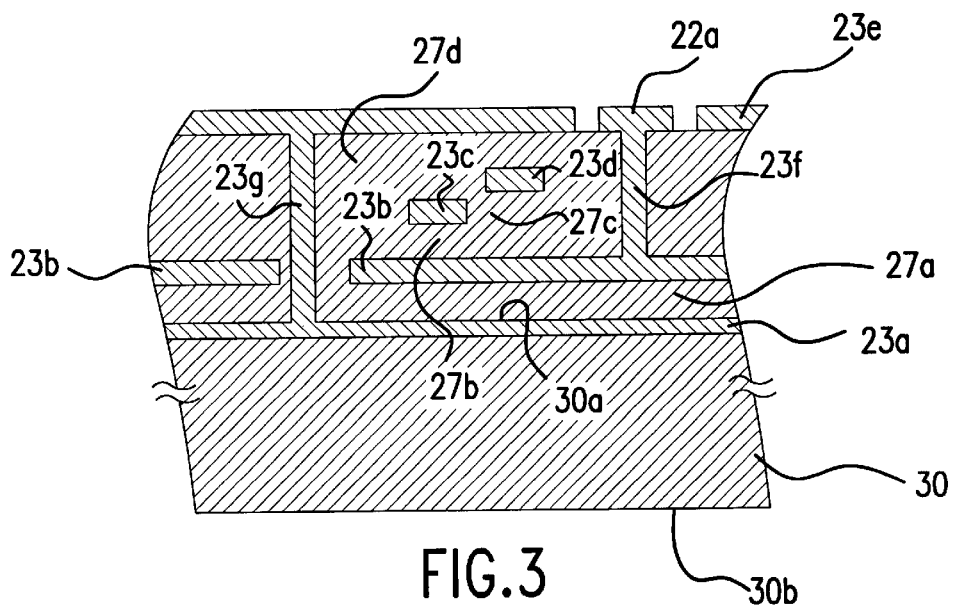
FIG. 3 is a cross-sectional view, taken along lines 3—3 of the module shown above in FIGS. 1 and 2.

Referring to both FIGS. 2 and 3, the module 12 is fabricated to minimize noise associated with the capacitive, inductive and resistive characteristics of the conductive traces disposed therein. The conductive traces are shown as 23a, 23b, 23c, 23d, 23e, 23f and 23g. The module 12 is typically fabricated employing a multi-level semiconductor metallization processes. As a result, the module 12 includes a silicon containing substrate 30 having opposed major surfaces 30a and 30b. A first conductive layer 23a is disposed adjacent to the major surface 30a. A second conductive layer 23b is positioned adjacent to, but spaced-apart from, the first conductive layer 23a. A first insulative layer 27a is disposed between the first and second conductive layers 23a and 23b. A third conductive layer 23c is positioned adjacent to, but spaced-apart from, the second conductive layer 23b, with a second insulative layer 27b disposed therebetween. Adjacent to the third conductive layer 23c is a third insulative layer 27c, with a fourth conductive layer 23d disposed adjacent to the third insulative layer 27c. A fifth conductive layer 23e is disposed adjacent to, but spaced-apart from, the fourth conductive layer 23d, with a fourth insulative layer 27d disposed therebetween. A conductive region 22a is positioned adjacent to fifth conductive layer 23e. Typically, insulative layers 27a, 27b, 27c, and 27d are formed from BCB Interconnection between the various conductive layers is achieved through the use of conductive vias. As shown, conductive via 23f places the conductive region 22a in electrical communication with the second conductive layer 23b. Conductive via 23g places the fifth conductive layer 23e in electrical communication with the first conductive layer 23a. Since all the vias 23f and 23g are located in a region of the module 12 above the first major surface 30a, custom changes to conductive regions 21 and 22 may be made easily at the manufacturing level by mask programming. For each new application, the location of the vias may be determined according to the particular IC interconnections desired. Once the locations of the vias have been determined, only the via-containing layers needs to be changed, i.e., masks employed to pattern the via-containing layers need to be changed.

Typically, the module 12 contains a multiple level interconnection matrix with at least 800 signal paths/cm$^2$. The configuration of the interconnection matrix is mask programmable and facilitates high-speed data signal propagation in excess of 20 GHz. The input and output (I/O) signals of the IC 10 can be routed to multiple sides thereof, effectively tripling the I/O density of the IC 10. The module 12 interconnection matrix is composed of at least two signal layers, such as conductive layers 23c and 23d, positioned between reference planes for power and ground, shown as conductive layers 23b and 23e, respectively. Typically, the conductive layers 23b–23e are formed from electroplated copper, with the signal layers 23c and 23d having thickness, "t", that is in the range of 3.5 to 5 micrometers. Conductive layer 23b provides a reference plane for $V_{dd}$ and includes a hiatus through which conductive via 23g extends. Conductive layer 23e provides a reference plane for ground. The presence of conductive layer 23a provides an additional reference plane for ground and serves to reduce noise in the module 12 that may be attributable to $V_{dd}$ being present on conductive layer 23b.

As is well known, during operation, the amount of current demand of the IC 10 can vary rapidly between several milliamps to tens of amps in a few nanoseconds. This may produce current spikes in the in the conductive layer 23b, producing a voltage drop (dv) across the inductance (L) associated with the conductive layer 23b that is directly proportional to the rate of change of the current dI/dt as follows:

$$dv = L \, dI/dt \qquad (1)$$

These voltage spikes may substantially reduce the operational frequency of the IC 10.

To reduce the voltage spikes, a de-coupling capacitor having a predetermined capacitance is defined by the insulative layer 27a located between the two spaced-apart conductive layers 23a and 23b. This may be achieved by substituting BCB for another insulative material. As an example of the above-identified de-coupling capacitor, layer 27a may be comprised of oxide-nitrogen-oxide having a thickness in the rage of 250 to 700 angstroms, with 500 angstroms being a typical thickness. The conductive layers 23a and 23b would have a thickness of between 2.5 and 5.0 micrometers. In this manner, the de-coupling capacitor would provide a capacitance in the range of 50 nF/cm$^2$ to 250 nF/cm$^2$. This provides sufficient capacitance to de-couple the voltage drop on conductive layer 23a from the IC 10.

Figure 4:
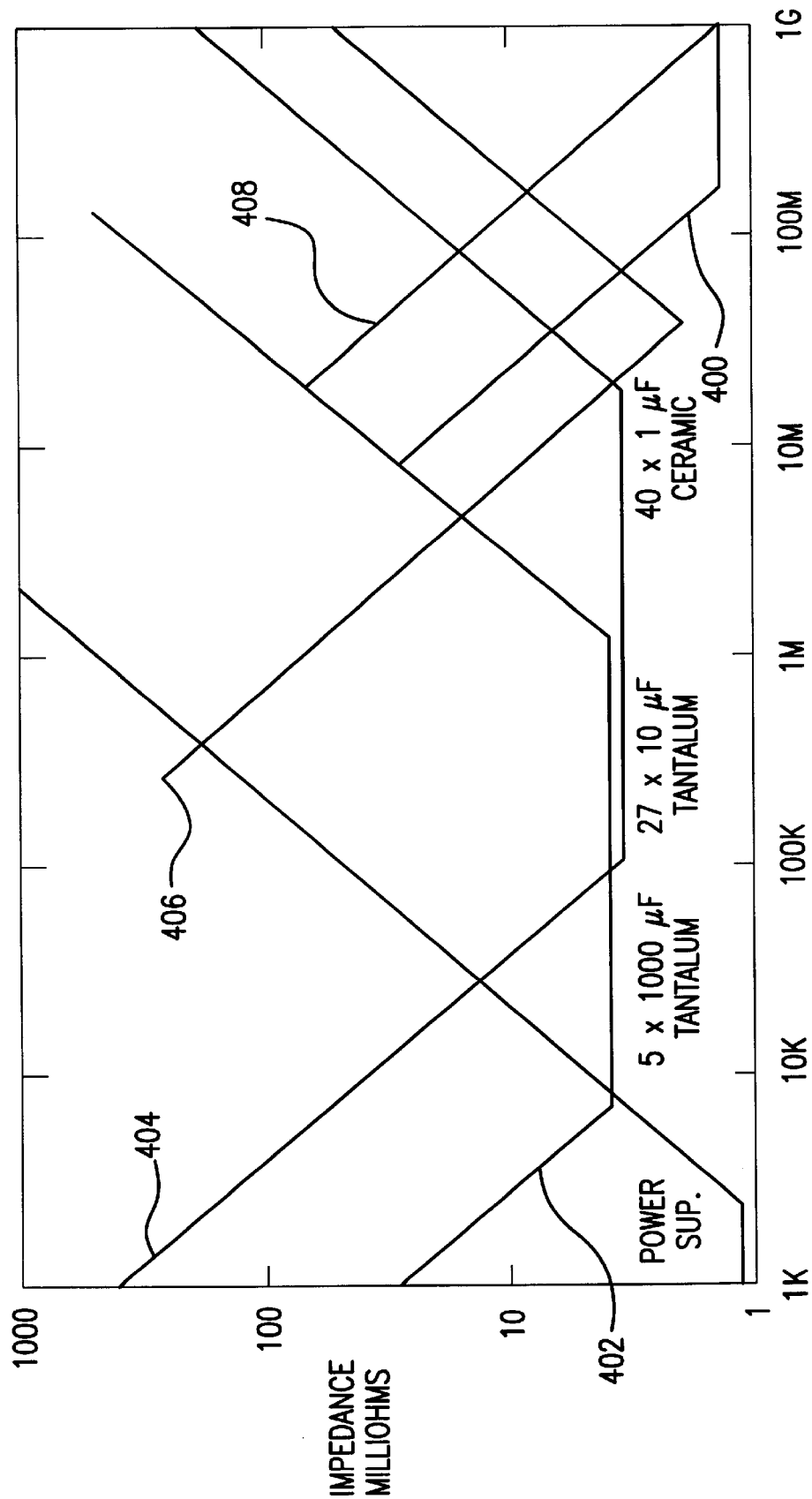
FIG. 4 is a graph of impedance versus frequency showing the operational characteristics of the present invention in comparison with prior art de-coupling capacitors.

As seen in FIG. 4, the aforementioned de-coupling capacitor provides a impedance as low as 1.3 milli-ohms in a range of frequencies from 200 Mghz to 1 Ghz. This is indicated by the slope of curve 400. When compared to the operational characteristics of traditional off-chip de-coupling capacitors, shown by the slope of curves 402, 404, 406 and 408, the present de-coupling capacitor provides de-coupling at substantially higher frequencies. The slope of curve 402 represents the operational characteristics of a de-coupling capacitor formed from five 1000 uF Tantalum capacitors. The slope of curve 404 represents the operational characteristics of a de-coupling capacitor formed from twenty-seven 10 uF Tantalum capacitors. The slope of curve 406 represents the operational characteristics of a de-coupling capacitor formed from forty 1 uF ceramic capacitors, and the slope of curve 408 represents the operational characteristics of a de-coupling capacitor formed from a chip oxide capacitor having a value of 150 nF.

In addition, the operational characteristics of the module are improved by the presence of a resistive differential between the two adjacent conductive layers 23a and 23b. As is well known, upon application of $V_{dd}$ to the conductive layer 23b, the conductive layer 23b behaves as a high-Q series-resonant circuit that may be modeled as follows:

$$Q=1/R(L/C)^{1/2} \quad (2)$$

where Q is the gain at resonance, and R is the resistivity of the material from which conductive layer 23b is formed. The variable L is the stray inductance associated with the conductive layer 23b and C is the stray capacitance associated with the same. The gain Q manifests as oscillations in adjacent conductive layers, such as signal layers 23a, as well as layers 23c and 23d. To reduce the oscillations from feeding back to the power supply and thereby propagating to all of the conductive layers, the material from which conductive layer 23a is formed has a greater resistivity associated therewith than the material from which conductive material 23b is formed. Specifically, conductive later 23b, as mentioned above is typically formed from copper or a copper alloy. This substantially increases the signal propagation speed thereon which facilitates the high operational speed of the de-coupling capacitor. As a result conductive layer 23b has a resistivity associated therewith approximating 1.72×10$^{-8}$ ohm-meter. Conductive layer 23a, on the other hand, is formed from a material having a higher resistivity, such as aluminum or an aluminum alloy which may be a resistivity in the range of 2.69×10$^{-8}$ ohm-meter to 4.30×10$^{-8}$ ohm-meter. As can be seen by equation 1, by increasing the resistivity, the gain associated with the current coupled to conductive layer 23a is reduced.

In addition, to reduce the probability that oscillations in conductive layer 23b reach either of conductive layers 23c and 23d, the conductive layer 23b associated with $V_{dd}$ is placed proximate to a conductive layer 23a on which a ground potential is present. This increases the probability that the return path for any excess current on the conductive layer 23b does not reach the signal layers 23c and 23d. Rather, the excess current would be capacitively coupled to conductive layer 23a.

Additional noise reduction in the module 12 is achieved by positioning the two spaced-apart signal layers 23c and 23d between two power planes 23b and 23e. With this configuration, noise associated with cross-talk in the signal layers 23b and 23e is reduced.

Cross-talk results from mutual capacitive coupling between two adjacent conductive traces due to signal current propagating thereon. For the module 12, the resulting cross-talk noise can be estimated as follows:

$$V_{cn}=0.176\times 10^{-9}(V_{in}/t\text{rise}) \quad (3)$$

where $V_{in}$=input voltage. Far end cross-talk tends to cancel and can be neglected. The position of conductive layers 23c and 23d allows the minimizing the distance that each of the signal layers 23c and 23d are spaced-apart from an adjacent power plane 23b or 23e. This maximizes the probability that the return path for the current in the signal propagating along one of the signal layers 23c and 23d is not a signal layer adjacent thereto, but rather one of the power planes 23b or 23e.

Noise may be further reduced by abrogating reflection noise, which is caused by an impedance mismatch between a driver and receiver. Reflection noise becomes problematic when the time of flight of a signal is comparable with the signal's rise time. Consequently, very short connections that satisfy the following constraint will minimize reflection noise problems.

$$t_{flight}<t_{rise}/4 \quad (4)$$

For a typical module 12 signal interconnect, the time of flight is:

$$\text{flight}\sim 50 \text{ pS.} \quad (5)$$

Hence, by keeping rise and fall times>200 ps, reflection noise and the resulting impact on settling time can be avoided. For 3.3V transitions, this translates into an interconnect load capacitance of <66 pF per interconnect. In this fashion, the module 12 provides a high-density routing structure with low noise by which to interconnect various pads of a single IC 10, or multiple ICs 10.

Figure 5:
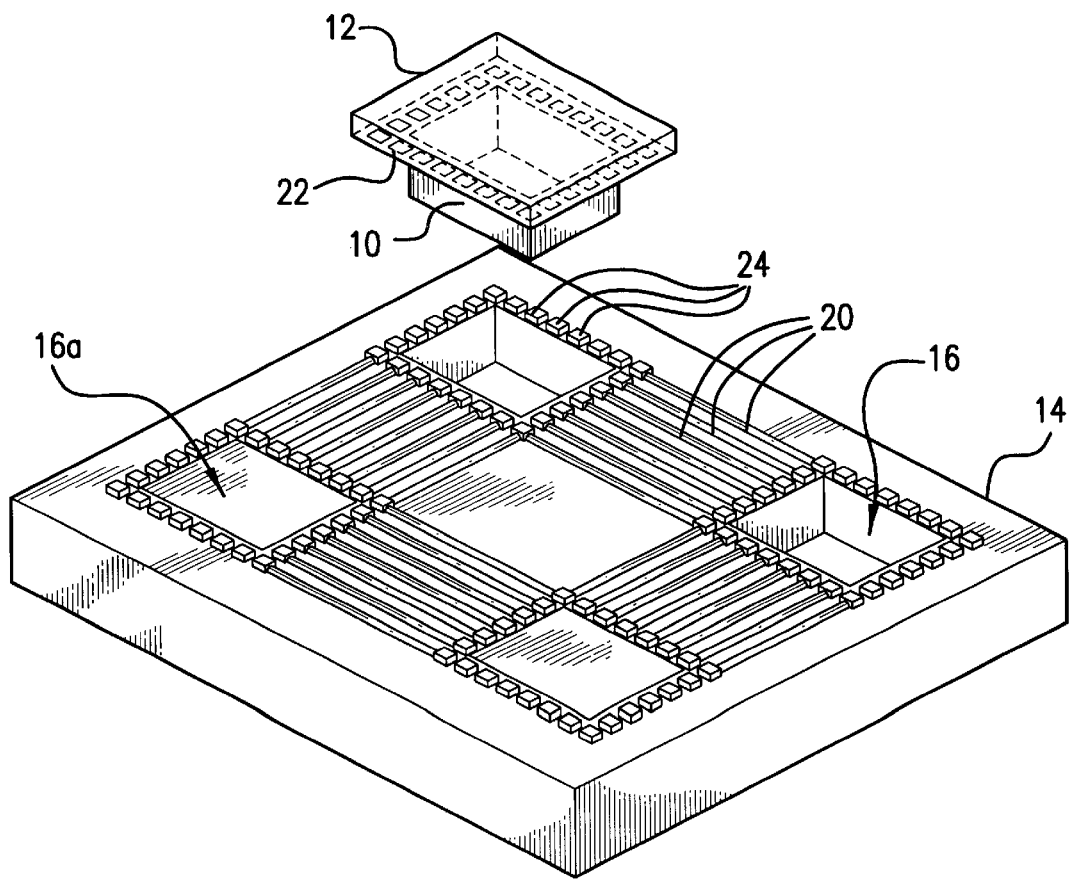
FIG. 5 shows an exploded perspective view of a subsystem including the subassembly, shown above in FIG. 1, and an interconnect substrate to which it is attached, in accordance with the present invention.

Referring to FIG. 5, once attached to the module 12, the IC 10 may be coupled to additional ICs (not shown) through the use of an interconnect substrate, an example of which is shown as 14, defining a subsystem 15. The interconnect substrate 14 may include a plurality of non-conductive regions which may be an insulative surface, shown as 16a, or an opening shown as 16b. As shown, the interconnect substrate 14 has four non-conductive regions, however, the number of non-conductive regions 16 changes according to the number of modules 12 to be connected to interconnect substrate 14. Similarly, although the non-conductive regions are shown to be of equal sizes, they may differ in size, dependent upon the dimensions of the IC to be electrically connected thereto.

Typically, module 12 is thermally compatible with interconnect substrate 14 and IC 10, since module 12 electrically connects IC 10 to the interconnect substrate 14. Thermal expansion compensation between IC 10, module 12, and interconnect substrate 14 to limit stresses due to thermal cycling may be accomplished by the use of compliant materials. For example, wires may be employed to make connections between the IC 10 and interconnect substrate 14. Alternatively, bonding materials may be used to limit the stresses. Typically module 12 and interconnect substrate 14 are be made of materials with similar Coefficient of Thermal Expansion (CTE) similar to IC 10, such as single crystal silicon. However, gallium arsenide or other materials with comparable CTE may also be utilized. To that end, interconnect substrate 14 is manufactured employing semiconductor photo lithographic processes; hence, the routing density of interconnections 20 on interconnect substrate 14 is higher than that for conventional printed wire board level interconnects.

Connections 22 on module 12 are pre-manufactured to correspond to the pattern of connections 24 on the interconnect substrate 14. The interconnect substrate 14 may serve, therefore, both as a mechanical base and implement at least a single layer of routing through interconnections 20 between neighboring modules and ICs 10. As illustrated in FIG. 5, no vias are present in the interconnect substrate 14 as the IC interconnections are preferably distributed among the modules by allowing signals between the ICs to be passed through neighboring chips; however, as described more fully below, vias may of course be utilized if needed.

Since all subsystem routing is distributed across the individual modules, the complexity of the interconnect substrate routing is reduced to single node sets. Compared to a single interconnection interconnect substrate, interconnection distributions among the modules 12 greatly simplify the interconnection task, and significantly improve the overall system performance. Although interconnect substrate 14 preferably has only one level of interconnect, in applications where yield is not critical, interconnect substrate 14 may have multiple levels of interconnect. In such applications, there would be vias in interconnect substrate 14 as the interconnections would include pass-throughs as well as crossovers, discussed above with respect to the module 12.

Figure 6:
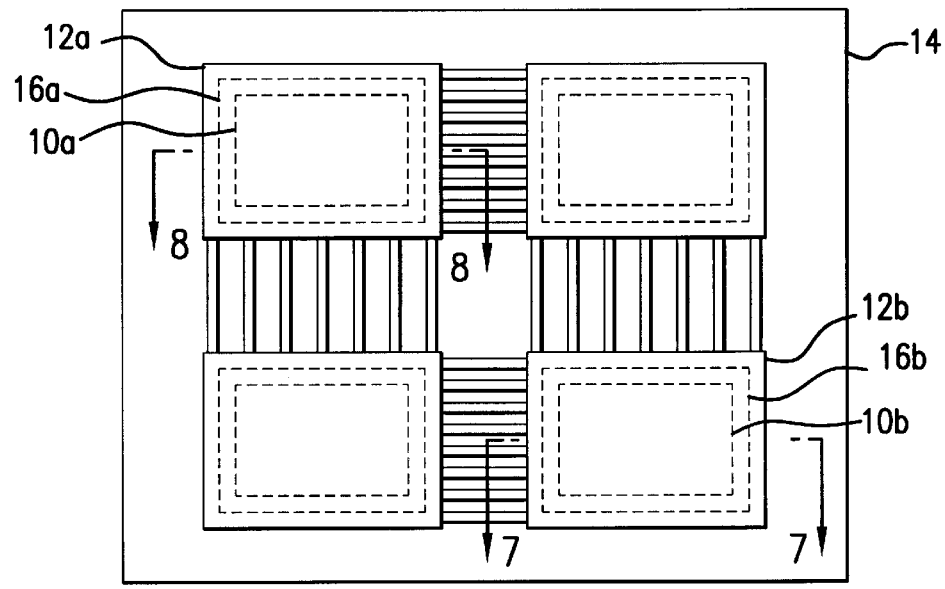
FIG. 6 is a top view of the subsystem, shown above in FIG. 5.
Figure 7:
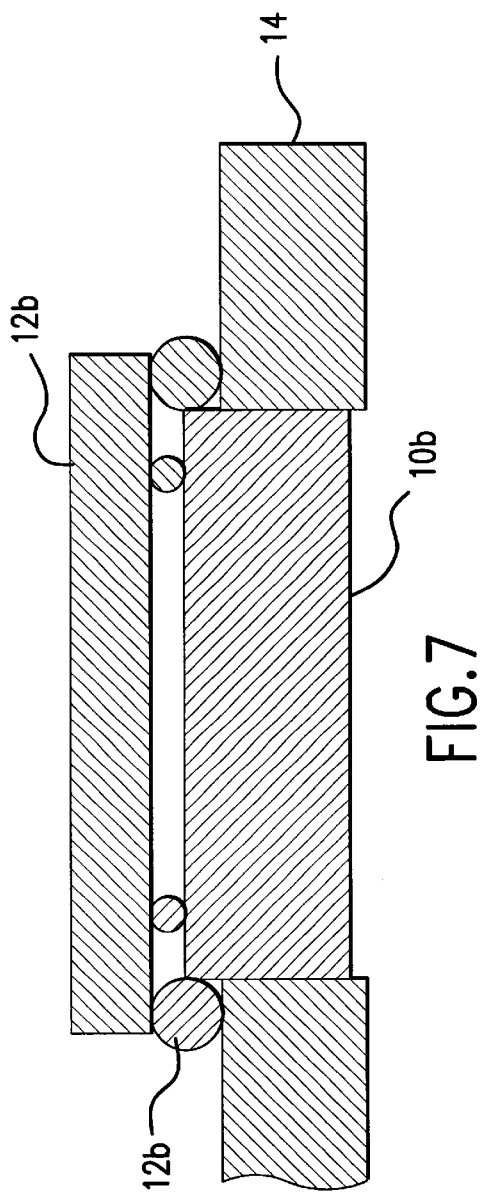
FIG. 7 is a partial cross-sectional view of the subsystem, shown above in FIG. 6, taken along lines 7—7.

Referring to FIGS. 6 and 7, each subassembly 11 associated with a non-conductive region of the interconnect substrate 14, having an opening 16b, is mounted so that the IC 10 fits therein. As can be seen, the module 12 extends around opening 16b and connects to interconnect substrate 14 through conductive regions 22. Typically, the number of conductive regions 21 between the IC 10 and the module 12 will not be equal to the number of connections 22 between module 12 and interconnect substrate 14. The use of opening 16b, enables a substantial number of the signal connections to lie in a plane formed by the top side of IC 10, the top side of module 12, and the top side of interconnect substrate 14. This configuration is very advantageous, as the chemical properties of silicon are such that it is difficult to form plated vias through silicon materials thicker than a few tenths of a micron. By using the same materials for module 12 and interconnect substrate 14, direct solder connections may be made between module 12 and interconnect substrate 14.

Since the IC 10 and the module 12 may be made from the same materials, signal connections may also be directly soldered on the module and connected to the IC 10. For example, solder bumps on module 12 are aligned to mirror IC 10's bond pad pattern. Hence, the IC 10 need not be solder bumped. The advantage of using solder bumps to connect the IC 10 to the module 12, and the module 12 to the interconnect substrate 14 is that an area array may be used to maximize the number of external signal connections available. In addition, parasitic capacitance and inductance associated with wire bonding may be eliminated. Solder bump flip chip bonding is an automated process, and the bumping cost does not increase with pin count. The flip-chip attachment process used for the module 12 and the interconnect substrate 14 assembly offers extremely low (<0.1 nH) parasitic inductance, and the module 12 contains non-perforated reference planes. Hence, the use of solder bumps also enables integration of higher I/O pin counts while keeping cost low.

The interconnect substrate 14, on the other hand, serves as a mechanical base for the module 12 while providing single-layer routing between adjacent modules 12. The combination of multi-layer module 12 interconnection matrix and the single-layer signal path of the interconnect substrate 14 interconnect effectively produces a continuous connect X-Y interconnect plane over the multi-chip subsystem. Modules 12 that do not have direct connections to a interconnect substrate 14 adjacent thereto share a common power plane with another module 12. Although it is not necessary, it is preferred that the modules 12 and/or the ICs 10 that are to be in data communication, i.e., electrically coupled, should be positioned proximate to each other.

In addition to providing adequate current-carrying paths for the total peak requirements of the individual IC 10, the combination module 12 and interconnect substrate 14 should provide sufficient power dissipation to satisfy the estimated power consumption of the subsystem 14. In an effort to improve the power characteristics of the combination module 12 and interconnect substrate 14, it is preferred that the IC 10 employ low-swing signal techniques.

Figure 8:
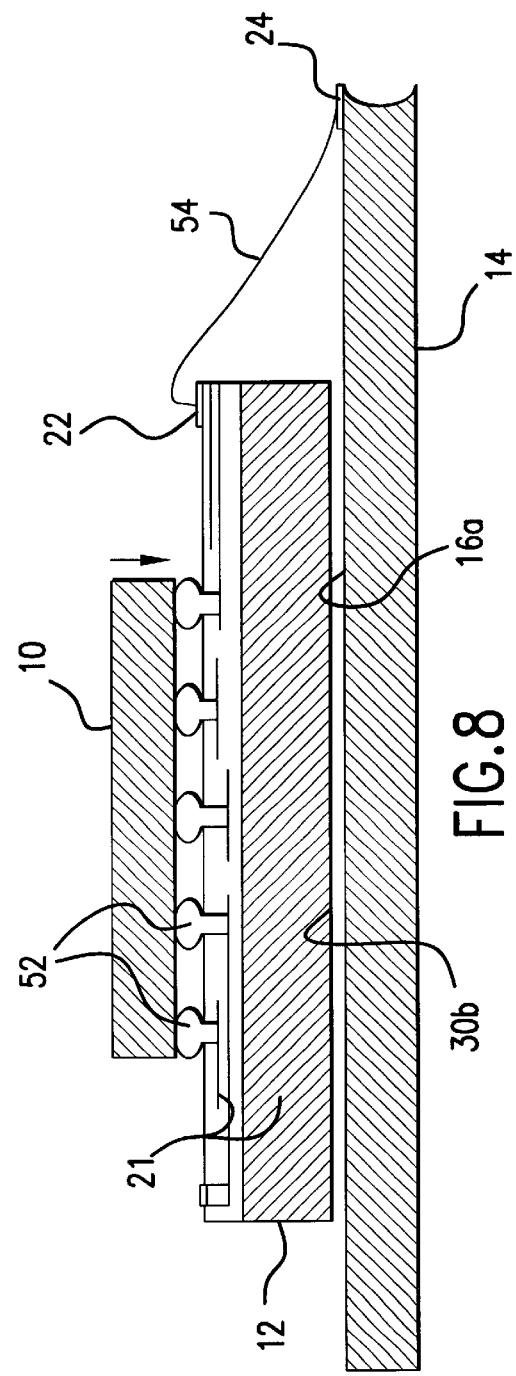
FIG. 8 is a partial cross-sectional view of the subsystem, shown above in FIG. 6, taken along lines 8—8.

Referring to both FIGS. 6 and 8, the module 12a affords great flexibility with the interconnection techniques that may be employed. For example, the module 12a may be bonded to the non-conductive region 16a of the interconnect substrate 14 using any suitable adhesive known, such as eutectic attach. In this manner, the second major surface 30b is attached to the non-conductive region, and the IC 10 may be may placed in electrical communication with the conductive regions 21 using solder balls. To that end, one or more of the conductive regions 21 includes a solder ball 52 disposed thereon. Electrical connection between the module 12 and the interconnect substrate 14 is achieved by use of one or more wirebonds, one of which is shown as 54. As shown, wirebond 54 extends between one of the conductive regions 22 and one of the connections 24 on the interconnect substrate 14. Alternatively, the solder balls 52 may be originally attached to the conductive areas 23 of the IC 10 which are subsequently attached to the conductive regions 21 of the module 12, shown more clearly in FIG. 9.

Referring to FIG. 10, alternatively, electrical communication between the module 12 and the IC 10 may be achieved via wirebond techniques. In this manner, one or more of the conductive areas 21 of the module 12 is placed in electrical communication with one or more of the conductive areas 23 of the IC 10 via a wire bond 56 extending therebetween, shown more clearly in FIG. 10.

Referring to both FIGS. 6 and 11, module 12a may be spaced apart from the non-conductive region 16a of the interconnect substrate 14 using solder ball attach techniques. In this manner, the conductive regions 22 of the module 12 are in electrical communication with the connections 24 on the interconnect substrate 14 via a solder ball 58. In this configuration, the second major surface 30b faces away from the non-conductive region 16a, with the IC 10 disposed therebetween. As before, the IC 10 may be placed in electrical communication with the conductive regions 21 using solder balls 52. To that end, one or more of the conductive areas 23 of the IC 10 includes a solder ball 52 disposed thereon. Alternatively, the solder balls may be originally attached to the conductive areas 21 of the module 12 which are subsequently attached to the conductive areas 23 of the IC 10, shown more clearly in FIG. 12.

Figure 13:
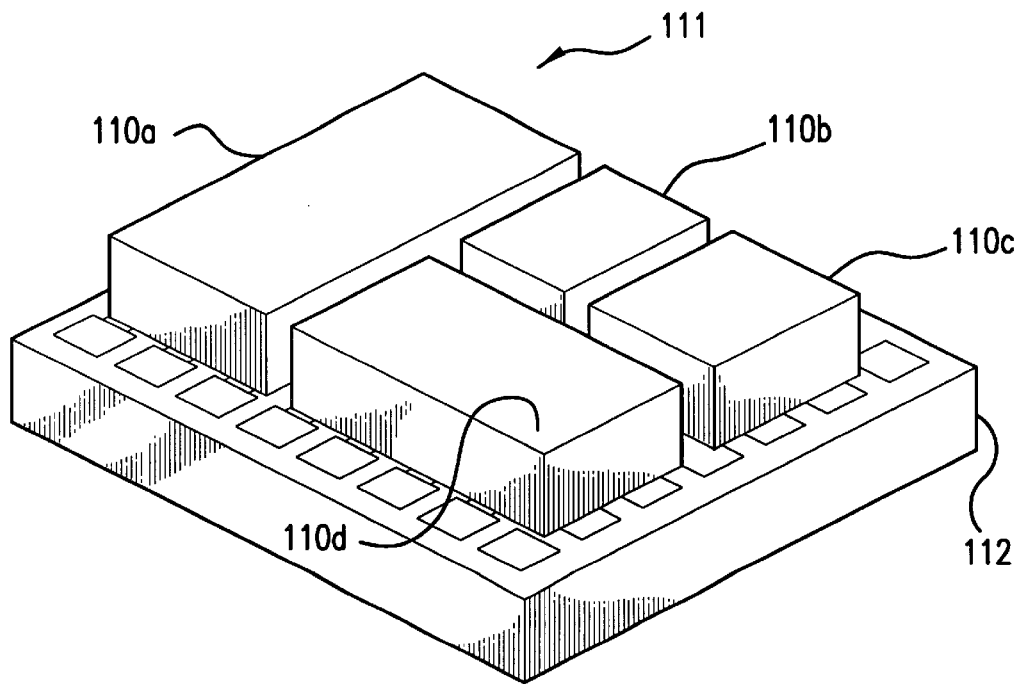
FIG. 13 is a perspective view of the module, shown above in FIG. 1, having multiple integrated circuits mounted thereon.

Referring again to FIG. 1, the foregoing has been discussed with respect to one IC 10 being attached to the module 12. It should be understood, however, that multiple ICs 110a, 110b, 110c and 110d may be attached to the module 112, allowing the same to functions as a multi-chip module 111, shown more clearly in FIG. 13. The invention should not be determined, therefore, based solely upon the foregoing description. Rather, the invention should be determined based upon the attached claims, including the full scope of equivalents thereof.

What is claimed is:

1. A module for an integrated circuits, the module comprising: an insulative body having, disposed therein, a conductive bond pad and a plurality of spaced apart conductive traces, one of which is in electrical communication with said bond pad, with each of said plurality of spaced-apart conductive traces being formed from a material having a resistivity associated therewith, with the resistivity of the material from which one of said plurality of spaced-apart conductive traces is formed, defining a power plane, being greater than the resistivity of the material from which at least one of the remaining conductive traces are formed, with said at least one of the remaining conductive traces defining a ground plane, said ground plane being disposed adjacent to, and spaced-apart from, said power plane, with a portion of the insulative body disposed between the power plane and the ground plane defining a decoupling capacitor.

2. The module as recited in claim 1 wherein said capacitor provides a capacitance per unit area in the range of 50 nF/cm² to 250 nF/cm².

3. The module as recited in claim 1 wherein said insulative body includes a plurality of bond pads disposed on a first major surface thereof and further including an insulative member having a plurality of signal traces and a plurality of bond sites disposed on a first major side thereof, with said plurality of bond sites enclosing a region of said insulative member and a subset of said plurality of bond pads being placed in electrical communication with said plurality of bond pads via wire bonds extending therebetween.

4. The module as recited in claim 3 wherein said integrated circuit includes a plurality of solder bumps thereon in electrical communication with circuitry associated with said integrated circuit, with said solder bumps being in electrical communication with a subgroup of said plurality of bond pads, the bond pads associated with said subgroup being mutually exclusive with the bond pads associated with said subset.

5. The module as recited in claim 3 wherein said insulative body include a plurality of solder balls and said integrated circuit includes a plurality of bond areas, with said plurality of solder balls being connected to said plurality of bond areas.

6. The module as recited in claim 1 wherein said insulative body includes a plurality of solder balls disposed on a first major surface thereof and further including an insulative member having a plurality of signal traces and a plurality of bond sites disposed on a first major side thereof, with said plurality of bond sites enclosing a region of said insulative member, said first major surface and said first major side, with a subset of said plurality of solder balls being placed in electrical communication with a plurality of bond pads.

7. The module as recited in claim 6 wherein said insulative body includes a plurality of bond pads and said integrated circuit includes a plurality of solder bumps thereon in electrical communication with circuitry associated with said integrated circuit, and with said solder bumps being in electrical communication with said plurality of bond pads.

8. The module as recited in claim 6 wherein said integrated circuit includes a plurality of bonding areas thereon in electrical communication with circuitry associated with said integrated circuit, with said bonding areas being in electrical communication with a subgroup of said plurality of solder balls, the solder balls associated with said subgroup being mutually exclusive with the solder balls associated with said subset.

9. A module for an integrated circuit, the module comprising:

an insulative body formed from insulative material and having, disposed therein, a plurality of spaced-apart power planes with differing resistivities associated therewith, a signal trace disposed spaced-apart from said plurality of spaced-apart power planes, and a conductive bond pad in electrical communication with said signal trace, said plurality of spaced-apart power planes including a $V_{dd}$ plane, formed from a material having a first resistivity associated therewith, and a ground plane, formed from matter having a second resistivity associated therewith, with said second resistivity being greater than said first resistivity, with insulative material disposed between said $V_{dd}$ and ground planes defining a decoupling capacitor having a predetermined capacitance associated therewith, with said signal trace lying between one of said plurality of spaced-apart power planes and a capacitive region.

10. The module as recited in claim 9 wherein said predetermined capacitance is in the range of 50 nF/cm² to 250 nF/cm².

11. The module as recited in claim 10 wherein said insulative body includes a plurality of conductive regions on a first major surface thereof and further including an insulative member having a plurality of signal traces and a plurality of bond sites disposed on a first major side thereof, with said first major surface facing away from said first major side and a subset of said conductive regions being in electrical communication with conductive areas of said integrated circuit and a second subset of said conductive regions being in electrical communication with said plurality of bond sites.

12. The module as recited in claim 10 wherein said insulative body includes a plurality of conductive regions on a first major surface thereof and further including an insulative member having a plurality of signal traces and a plurality of bond sites disposed on a first major side thereof, with said first major surface facing said first major side and a subset of said conductive regions being in electrical communication with conductive areas of said integrated circuit and a second subset of said conductive regions being in electrical communication with said plurality of bond sites.

13. A method for forming a module for an integrated circuit comprising:

providing an insulative substrate:

forming a ground plane on said substrate having a resistivity associated therewith;

forming, adjacent to said ground plane, an insulative layer;

forming a decoupling capacitor by forming, adjacent to said insulative layer, a power plane, with said power plane having a resistivity associated therewith that is less than the resistivity associated with said ground plane; and forming a contact point in electrical communication with said ground plane.

14. The method as recited in claim 13 further including forming said first insulative layer with a material having sufficient dimensions to provide a capacitance between the ground and power planes in the range of 50 nF/cm$^2$ to 250 nF/cm$^2$.

15. The method as recited in claim 13 wherein forming a contact point, includes forming a plurality of contact points, a first subset which are in electrical communication with said power plane and placing said integrated circuit in electrical communication with said plurality of contact points, and further including providing an insulative member having a plurality of bond sites thereon and placing said plurality of bond sites in electrical communication with a subgroup of said plurality of contact points.

* * * * *